United States Patent
Hsu

(10) Patent No.: US 6,175,938 B1
(45) Date of Patent: Jan. 16, 2001

(54) SCHEME FOR THE REDUCTION OF EXTRA STANDBY CURRENT INDUCED BY PROCESS DEFECTS

(75) Inventor: Chao-Shuenn Hsu, Tainan Hsien (TW)

(73) Assignee: Winbond Electronics Corp. (TW)

( * ) Notice: Under 35 U.S.C. 154(b), the term of this patent shall be extended for 0 days.

(21) Appl. No.: 09/081,663

(22) Filed: May 20, 1998

(30) Foreign Application Priority Data

Jan. 16, 1998 (TW) .................................................. 87100585

(51) Int. Cl.[7] .............................. G11C 29/00; G11C 7/00; G01R 31/28
(52) U.S. Cl. ........................... 714/718; 714/711; 714/725; 365/200; 365/201; 365/227; 365/229; 326/13; 326/14
(58) Field of Search ..................................... 714/718, 710, 714/711; 365/201, 200, 227, 228, 210, 229; 326/13, 14, 101; 327/530

(56) References Cited

U.S. PATENT DOCUMENTS

| 4,228,528 | * | 10/1980 | Cenker et al. | 365/201 |
|---|---|---|---|---|
| 4,713,814 | * | 12/1987 | Andrusch et al. | 713/718 |
| 4,761,767 | * | 8/1988 | Ferrant | 365/200 |
| 5,111,073 | * | 5/1992 | Suzuki et al. | 307/442 |
| 5,262,993 | * | 11/1993 | Horiguchi et al. | 365/200 |
| 5,289,475 | * | 2/1994 | Slemmer | 714/718 |
| 5,410,510 | * | 4/1995 | Smith et al. | 365/201 |
| 5,677,917 | * | 10/1997 | Wheelus et al. | 714/724 |

\* cited by examiner

Primary Examiner—Emmanuel L. Moise
(74) Attorney, Agent, or Firm—Birch, Stewart, Kolasch & Birch, LLP

(57) ABSTRACT

A scheme for reduction of extra standby current induced by process defects is disclosed. After the bit lines and cells with failure due to process defects are repaired by using redundancy in the repairing process, the fuses connected with the pull-transistors coupled to the defect bit lines are disconnected, therefore cutting the leakage current completely. The standby leakage current can be reduced such that the SRAM can pass the standby current test and the yield is improved.

8 Claims, 2 Drawing Sheets

SCHEME FOR THE REDUCTION OF EXTRA STANDBY CURRENT INDUCED BY PROCESS DEFECTS

BACKGROUND OF THE INVENTION

1. Field of the Invention

The present invention relates in general to a repairing method, more specifically, to a repairing scheme for the reduction of extra standby current induced by process defects.

2. Description of the Related Art

As the portable electronic products such as notebook computers, cellular phone, and personal digital agency (PDA) are widely used, the demands of static random access memory (SRAM) are also increasing. In order to prolong the life of the battery used by the portable electronic products, generally the integrated circuits (ICs) must meet the requirement for low power consumption. To achieve the object, the ICs are designed to have a small standby current, thereby reducing the unnecessary power consumption.

FIG. 1 illustrates the structure of a conventional SRAM. In FIG. 1, C1, C2~Cn represent the memory cells of SRAM; WL1, WL2~WLn represent the word lines; BL, BLB are bit lines (bit-line and bit-line bar); and Q1, Q2 are pull-up transistors which are always kept in an on state. The bit lines BL and BLB may be shorted to the ground (for example Vss) due to the process defects such as metal defects, etc. Although using redundancy can repair those defects, there are still some problems. Since the pull-up transistors in a cell are always on, therefore a leakage current (about 1~2 mA in general) may flow through bit lines to the ground, even if other defects are repaired. The leakage currents may not influence the logic function of SRAM, however, the SRAM will consume a great amount of power even in a standby state. So the SRAM will be picked out in a standby current test. A minority of the above current defects will induce a total standby current over the specification, and the whole chip will be discarded, even though the logic function of SRAM is correct. Consequently, the yield is reduced, and the cost is raised.

SUMMARY OF THE INVENTION

Therefore, an object of the present invention is to provide a scheme for reduction of extra standby current induced by process defects. According to the present invention, after the bit lines and cells, with failure due to process defects, are repaired by using redundancy in a repairing process, the fuses connected with the pull-transistors coupled to the defect bit lines are disconnected, therefore cutting the leakage current completely.

Another object of the present invention is to reduce the standby leakage current such that the SRAM can pass the standby current test and the yield is improved.

The present invention achieves the above-indicated objects by providing a scheme for the reduction of extra standby current induced by process defects as described as follows, wherein every one of the pull-up transistors of the memory cells is connected with a fuse.

The test scheme starts to test the memory cells in a SRAM chip of a wafer to identify the addresses and locations of defect bit lines.

Next, test the other chips of the wafer in a lot and store the failure information data for repairing process.

Test the other wafers of the lot and store the failure information data for repairing process.

Then the repairing process is carried out by using redundancy to repair the defects of chips according to the failure information data, wherein the fuses connected with said pull-transistors corresponding to said defect bit lines are disconnected while finishing repairing.

Finally, the chips are tested again for proper verification of repairing.

The above steps of the test scheme takes the lot as a test unit, while the scheme can take a whole wafer as a test unit, and the steps are described as follows.

(a) The test scheme starts to test the memory cells in a SRAM chip to identify the addresses and locations of defective bit lines.

(b) Step (a) is repeated to test the chips of the whole wafer and storing the failure information data for a repairing process.

(c) The defects of chips are repaired in the repairing process by using redundancy according to the failure information data, wherein the fuses connected with said pull-transistors corresponding to said defective bit lines are disconnected while finishing the repairing process.

(d) Next, the chips are tested again for proper verification of repairing.

(e) Finally, step (a) to step (d) are carried out for testing and repairing other wafers.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE PREFERRED EMBODIMENTS

Figure 1:
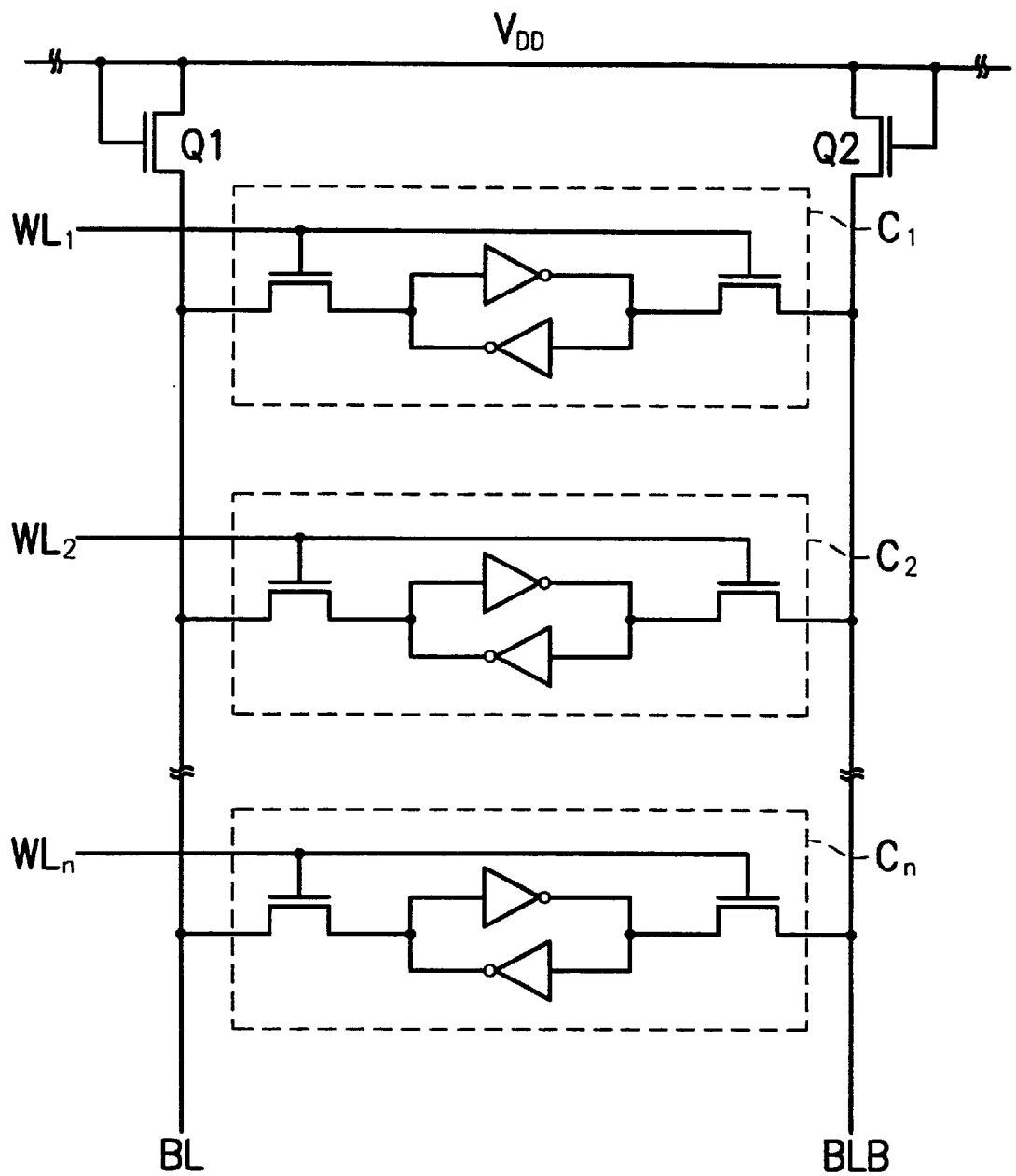
FIG. 1 illustrates a structure diagram of a conventional SRAM.
Figure 2:
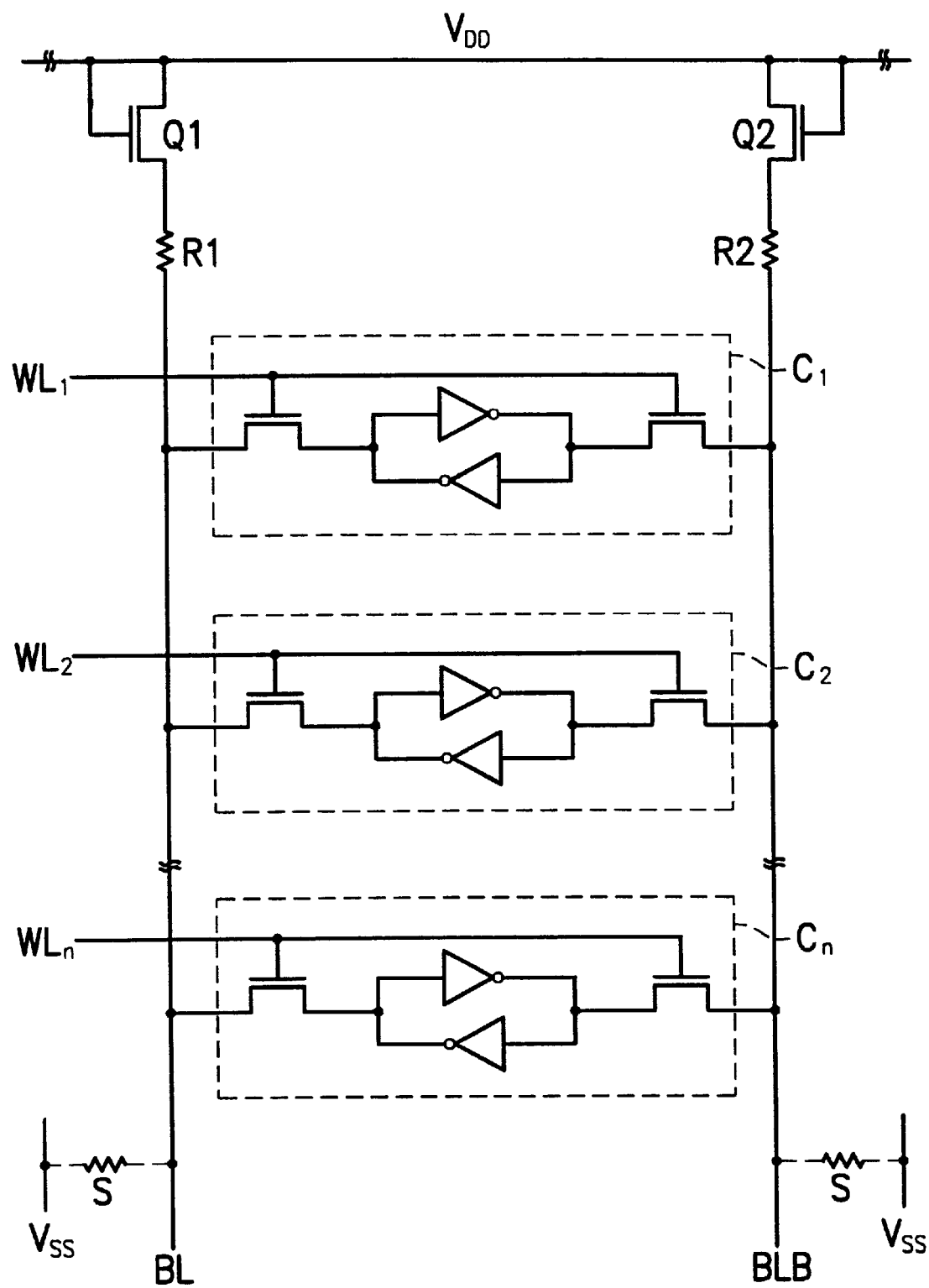
FIG. 2 illustrates a structure diagram of a SRAM appropriate for the test scheme according to the present invention.

The difference between the conventional SRAM structure and what is depicted in FIG. 2 is that the pull-up transistor Q1 (and Q2) and the bit line BL (and BLB) are connected with a fuse made of polysilicon resistor R1 (and R2) in the SRAM structure depicted in FIG. 2.

The bit lines BL, BLB may short to ground Vss due to the process defects such as bad or failed memory cells or bit lines, etc. As described above, a constant leakage current will flow from voltage source $V_{DD}$ to ground Vss, even if the bad cells have been repaired.

The present invention provides a test scheme to cut the possible leakage current completely by disconnecting the polysilicon fuses connected between the sources of pull-up transistors (or the drains of pull-up transistors) and the bit lines (or the voltage source $V_{DD}$) after completing the repairing process. As shown in FIG. 2, in the cell of the SRAM structure appropriate for the test scheme, the sources of the pull-up transistors Q1 and Q2 are connected with polysilicon fuses R1 and R2 respectively, for example.

The first embodiment of the present invention is described in detail as the following steps.

In step (a), the test scheme starts to test all the memory cells in a semiconductor chip to identify the addresses and locations of defect bit lines.

Next in step (b), step (a) is carried out again to test all the chips of the whole wafer and store the failure information data for a repairing process.

Further in step (c), step (b) is repeated to test all the wafers of the whole lot (or whole batch) and store the failure information data for the repairing process.

In step (d), the repairing process is carried out by using redundancy to repair the defects of all chips according to the failure information data. Then, the fuses connected with said pull-transistors corresponding to said defect bit lines are disconnected such that the leakage path is cut.

Finally in step (e), all the chips are tested again for proper verification of repairing.

Form the above descriptions, the possible leakage current path form voltage source VDD through pull-up transistors, bit lines to ground is cut, therefore, the leakage current reduction is possible. The SRAM can pass the standby current test and the yield is also improved.

The above steps of the test scheme takes the whole lot as test unit, while the scheme can take whole wafer as test unit, and the steps are described as follows.

In step (a), the test scheme starts to test all the memory cells in a semiconductor chip to identify the addresses and locations of defect bit lines.

Next in step (b), step (a) is repeated to test all the chips of the whole wafer and store the failure information data for a repairing process.

In step (c), the defects of all chips are repaired in the repairing process by using redundancy according to the failure information data. Then, the fuses connected with said pull-transistors, corresponding to said defect bit lines, are disconnected to cut the possible leakage current path.

Further in step (d), all the chips are tested again for proper verification of repairing.

Finally in step (e), from step (a) to step (d) are carried out for testing and repairing other wafers.

Similarly, the possible leakage current path form voltage source VDD through pull-up transistors, bit lines to ground is cut, after completing the repairing process. The leakage current is reduced as less as possible, and SRAM will not be picked out during the standby current test, thus improving the yield and reducing the fabricated cost. Furthermore, every memory cell of the SRAM appropriate for the novel test scheme require only two additional fuses connected to the pull-up transistors, so it is very simple and does not influence the function of SRAM. The steps for carrying out the test scheme according to the present invention is simple, therefore it is very useful and economical to the industry.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded to the broadest interpretation so as to encompass all such modifications and similar arrangements.

What is claimed is:

1. A method for reducing extra standby current induced by process defects, comprising the steps of:
   (a) providing a plurality of wafers having thereon a plurality of SRAM chips having corresponding SRAM cells
   (b) testing SRAM cells of one of the SRAM chips on one of the plurality of wafers to identify and store addresses and locations of defective bit lines in the one of the SRAM chips for a subsequent repairing process, each SRAM cell having a plurality of pull-up transistors, fuses, and bit lines, wherein one of the fuses is positioned between each one of the plurality of pull-up transistors and the plurality of bit lines, respectively;
   (c) testing each SRAM chip on said one of the plurality of wafers using said testing step (b);
   (d) testing each one of the plurality of wafers using said testing steps (b) and (c);
   (e) repairing a defective bit line found in any one of said testing steps (b)–(d) by replacing each defective bit line with redundancy;
   (f) opening each fuse, of the plurality of fuses, corresponding to defective bit lines determined during any one of said testing steps (b)–(d); and
   (g) repeating said testing steps (b)–(d) to verify proper repair during said repairing step (e).

2. The scheme as claimed in claim 1, wherein the plurality of fuses are made of polysilicon.

3. The scheme as claimed in claim 1, wherein each of the plurality of fuses is connected between a bit line and the source of the pull-up transistor.

4. The scheme as claimed in claim 1, wherein each of the plurality of fuses is connected between the drain of the pull-up transistor and a voltage source.

5. A method for reducing extra standby current induced by process defects, comprising the steps of:
   (a) providing a wafer having thereon a plurality of SRAM chips having corresponding SRAM cells
   (b) testing SRAM cells of one of the SRAM chips on the wafer to identify and store addresses and locations of defective bit lines in the one of the SRAM chips for a subsequent repairing process, each SRAM cell having a plurality of pull-up transistors, fuses, and bit lines, wherein one of the fuses is positioned between each one of the plurality of pull-up transistors and the plurality of bit lines, respectively;
   (c) testing each SRAM chip on the wafer using said testing step (b);
   (d) repairing a defective bit line found in any one of said testing steps (b)–(c) by replacing each defective bit line with redundancy;
   (f) opening each fuse, of the plurality of fuses, corresponding to defective bit lines determined during any one of said testing steps (b)–(c); and
   (g) repeating said testing steps (b)–(c) to verify proper repair during said repairing step (e).

6. The scheme as claimed in claim 5, wherein the plurality of fuses are made of polysilicon.

7. The scheme as claimed in claim 5, wherein each of the plurality of fuses is connected between a bit line and the source of the pull-up transistor.

8. The scheme as claimed in claim 5, wherein each of the plurality of fuses is connected between the drain of the pull-up transistor and a voltage source.

* * * * *